United States Patent
Park et al.

(10) Patent No.: US 6,426,308 B1
(45) Date of Patent: *Jul. 30, 2002

(54) METHODS FOR FORMING FILMS HAVING HIGH DIELECTRIC CONSTANTS

(75) Inventors: Young-wook Park, Kyungki-do; Moon-yong Lee, Seoul; Kyung-hun Kim, Seoul; In-sung Park, Seoul, all of (KR)

(73) Assignee: Samsung Electronics Co., Ltd. (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 10 days.

(21) Appl. No.: 09/209,196

(22) Filed: Dec. 10, 1998

Related U.S. Application Data

(62) Division of application No. 08/707,904, filed on Sep. 12, 1996, now Pat. No. 5,910,218.

(30) Foreign Application Priority Data

Nov. 28, 1995 (KR) .............................. 95-44270

(51) Int. Cl.[7] ...................... H01L 21/31; H01L 21/469; H01L 21/8242
(52) U.S. Cl. ...................... 438/785; 438/240
(58) Field of Search ................. 438/264, 261, 438/216, 287, 591, 785, 240; 118/716, 719

(56) References Cited

U.S. PATENT DOCUMENTS

| | | | |
|---|---|---|---|
| 5,016,332 A | * 5/1991 | Reichelderfer et al. | 29/25.01 |
| 5,111,355 A | 5/1992 | Anand et al. | 361/313 |
| 5,119,760 A | * 6/1992 | McMillan et al. | 118/722 |
| 5,234,556 A | * 8/1993 | Oishi et al. | 204/157.51 |
| 5,254,505 A | 10/1993 | Kamiyama | 437/235 |
| 5,336,638 A | * 8/1994 | Suzuki | 437/190 |
| 5,468,687 A | * 11/1995 | Carl et al. | 438/393 |

(List continued on next page.)

FOREIGN PATENT DOCUMENTS

| JP | 6-177141 | * 6/1994 | ......... H01L/21/324 |
|---|---|---|---|

OTHER PUBLICATIONS

Moslehi, Mehrdad, Formation of MOS Gates by Rapid Thermal/Microwave Remote Plasma Multiprocessing, IEEE Electron Device Letters, vol. EDL–8, No. 9, Sep. 1987.*

Ohji et al., Improvement In Stoilchiometric Composition Of CVD–Ta2O5 Capacitor Dielectric Films For DRAM, (Abstract), Proc.–Electrochem. Soc. (1993), 93–25 (Interconnects, Contact Metallization, and Multilevel Metallization/Reliability for Semiconductor Devices, Interconnects, and Thin Insulator Materials), pp. 400–409.

Maeda, Ozone Applied In Semiconductor Industry, (Abstract), VLSI, Kurin Tekunoroji, 5, pp. 45–49 (1995).

Fujino et al., Low–Temperature Atmospheric–Pressure Chemical Vapor Deposition Using 2,4,6,8–tetramethylcyclotetrasiloxane And Ozone, (Abstract), Japanese Journal of Applied Physics, Part 1: Regular Papers & Short Notes & Review Papers, vol. 33, No. 4A, pp. 2019–2024 (Apr. 1994).

(List continued on next page.)

*Primary Examiner*—Olik Chaudhuri
*Assistant Examiner*—Erik Kielin
(74) *Attorney, Agent, or Firm*—Myers Bigel Sibley & Sajovec

(57) ABSTRACT

A method form forming a dielectric film on a substrate includes the steps of placing the substrate in a process chamber wherein said substrate is isolated from an external environment, depositing the dielectric film on the substrate in the process chamber, and annealing the dielectric film in said process chamber. In particular, the dielectric film can be formed from $Ta_2O_5$. Systems for forming the dielectric film are also disclosed.

8 Claims, 3 Drawing Sheets

U.S. PATENT DOCUMENTS

| | | | | |
|---|---|---|---|---|
| 5,486,488 A | * | 1/1996 | Kamiyama | 437/60 |
| 5,508,221 A | * | 4/1996 | Kamyima | 437/60 |
| 5,525,550 A | * | 6/1996 | Kato | 438/788 |
| 5,569,619 A | * | 10/1996 | Roh | 438/239 |
| 5,661,319 A | | 8/1997 | Fujii et al. | 257/295 |
| 5,688,724 A | | 11/1997 | Yoon et al. | 437/235 |
| 5,766,360 A | | 6/1998 | Sato | 118/666 |
| 5,769,588 A | | 6/1998 | Toshima | 414/217 |
| 5,769,952 A | | 6/1998 | Komino | 118/773 |
| 5,817,156 A | * | 10/1998 | Tateyama et al. | 29/25.01 |
| 5,837,593 A | * | 11/1998 | Park | 438/396 |
| 5,856,240 A | * | 1/1999 | Sinha et al. | 438/758 |
| 5,913,117 A | * | 6/1999 | Lee | 438/240 |

OTHER PUBLICATIONS

Treichel et al., Deposition, Annealing, And Characterization Of Tantalum Pentoxide Films, (Abstract), Proceedings of the 3$^{rd}$ Biennial Meeting of Chemical Perspectives of Microelectronic Materials, Mater. Res. Soc, vol. 282, pp. 557–568 (1993).

Ichinose et al., Preparation and Rapid Thermal Annealing Effect of (Ba, Sr)TiO$_3$ Thin Films, Jpn. J. Appl. Phys., vol. 34, Pt. 1, No. 9B, pp. 5198–5201 (1995).

Caplus 1991: 197622 (1991) Abstract only.

Caplus 1994: 258897 (1994) Abstract only.

Caplus 1995:513462 (1995) Abstract only.

Inspec 94:4703350 (1994) Abstract only.

Inspec 94:4687689 (1994) Abstract only.

Hiroshi Shinriki et al., UV–O$_3$ and Dry–O$_2$: Two–Step Annealed Chamical Vapor–Deposited TA$_2$O$_5$ Films for Storage Dielectrics of 640Mb DRAM's, IEEE Transactions On Electron Devices, vol. 38, No. 3, pp. 455–462 (Mar. 1991).

Shinriki, H., et al., UV–O$_3$ and Dry–O$_2$: Two–Step Annealed Chemical Vapor–Deposited Ta$_2$O$_5$ Films for Storage Dielectrics of 64–Mb DRAM's, *IEEE Trans. Elect. Dev.*, vol. 38, No. 3, pp. 455–462 (Mar. 1991).

\* cited by examiner

METHODS FOR FORMING FILMS HAVING HIGH DIELECTRIC CONSTANTS

This application is a division of Ser. No. 08/707,904 filed Sep. 12, 1996 Pat. No. 5,910,218.

FIELD OF THE INVENTION

The present invention relates to the field of microelectronics and more particularly to dielectric films for microelectronic circuits.

BACKGROUND OF THE INVENTION

A dynamic random access memory (DRAM) includes an array of memory cells with each memory cell having a capacitor and a transistor. As DRAMs become more highly integrated, the size of the capacitor and the operating voltage both decrease. Because a predetermined charge is required on the capacitor to discriminate between logic levels, reductions in the size of the capacitor may be limited by the capacitance required to store the predetermined charge. The electrical charge Q of a capacitor is determined by multiplying the capacitance C by the operating voltage V. Accordingly, in order to store a predetermined charge at a lowered operating voltage, the capacitance of the capacitor must be increased.

The capacitance of a capacitor can be increased by increasing the effective area of the capacitor, by increasing the dielectric constant of the dielectric layer, and by decreasing the thickness of the dielectric layer. Because increasing the effective area of a capacitor may require an increase in the size of the capacitor, and because decreasing the thickness of the dielectric layer may be limited by manufacturing constraints, these approaches to increasing capacitance may not be sufficient. The use of dielectric materials having higher dielectric constants may, however, provide increased capacitance while reducing the size of the capacitor without requiring a dielectric thickness which is unnecessarily difficult to produce. For example, $Ta_2O_5$ can be used to produce a dielectric film having a significantly higher dielectric constant than a dielectric film of the same thickness formed from silicon oxide $SiO_2$. The film formed from $Ta_2O_5$ can have a dielectric constant on the order of 20 to 25. Accordingly, when using a $Ta_2O_5$ film as the dielectric layer of a capacitor, the surface areas of the capacitor electrodes can be reduced without reducing the capacitance and without significantly increasing manufacturing costs.

A flowchart for a method of forming a capacitor including a $Ta_2O_5$ dielectric film is illustrated in FIG. 1. A method for forming a capacitor includes the steps of forming a lower electrode of the capacitor S1, cleaning the lower electrode surface to remove a naturally occurring oxide film therefrom S2, rapid thermal processing S3, depositing the $Ta_2O_5$ film S4, annealing the $Ta_2O_5$ film with ultraviolet light and ozone ($O_3$) S5, annealing the $Ta_2O_5$ film with oxygen ($O_2$) S6, and forming an upper electrode for the capacitor S7.

The step of rapid thermal processing S3 eliminates an oxidation barrier generated at an interface between the lower electrode and the $Ta_2O_5$ film. The rapid thermal processing step may be provided as a succession of heat treatments. The step of annealing the $Ta_2O_5$ film with ultraviolet light and ozone ($O_3$) S5 reduces oxygen vacancies in the $Ta_2O_5$ film. The step of oxygen ($O_2$) annealing S6 reduces weak spots in the $Ta_2O_5$ film.

It is known, for example, to reduce leakage current of a $Ta_2O_5$ film by annealing the film. An annealing method is described in a publication by Shinriki et al. entitled "UV-$O_3$ DRY-$O_2$: Two-Step Annealed Chemical Vapor-Deposited $Ta_2O_5$ Films For Storage Dielectrics Of 64-Mb DRAM's", IEEE Transactions On Electron Devices, Vol. 38, No. 3, March 1991, pp. 455–462, the disclosure of which is hereby incorporated herein by reference.

Typically, a deposition system is used to deposit the $Ta_2O_5$ film, and separate systems are used to anneal and clean the structure. Accordingly, the $Ta_2O_5$ dielectric film may be exposed to air resulting in the adsorption of water and/or free carbon. Accordingly, exposure to air may cause deterioration of the dielectric layer and the adjacent electrodes. In addition, the loading and unloading of the production substrates from one system to the next may result in unnecessary heating and cooling between each step as well as unnecessary transfers of the material thus reducing the efficiency of the process and lowering the throughput.

SUMMARY OF THE INVENTION

It is therefor an object of the present invention to provide improved methods and systems for forming dielectric films.

It is another object of the present invention to provide methods and systems for forming dielectric films with improved dielectric characteristics.

It is still another object of the present invention to provide methods and systems for forming dielectric films while reducing exposure to the atmosphere.

These and other objects according to the present invention are provided by methods and systems for forming dielectric films including the steps of placing a substrate in a process chamber, depositing the dielectric film on the substrate in the process chamber, and annealing the dielectric film in the process chamber. By both depositing and annealing the dielectric film in the process chamber, the substrate and film can be isolated from the external environment between the steps of depositing and annealing the dielectric film. Accordingly, adsorption of moisture and free carbon from the air can be reduced thus improving the characteristics of the dielectric film.

In particular, the dielectric film may comprise a material with a high dielectric constant, such as $Ta_2O_5$. $Ta_2O_5$ has a dielectric constant on the order of 20–25 which is significantly higher than that of silicon dioxide. Alternately, the film may comprise another material having a high dielectric constant, such as $BaSrTiO_3$ (BST) or $PbZrTiO_3$ (PZT).

In addition, the step of depositing the dielectric film can include raising the temperature inside the process chamber to a first temperature and depositing the dielectric film. The step of annealing the film can include lowering the temperature inside the process chamber from said first temperature to a second temperature and annealing the dielectric film to fill oxygen vacancies therein. By heating the process chamber to different temperatures, the steps of depositing and annealing the dielectric film can be accommodated in the same process chamber. More particularly, the first temperature can be in the range of 350 to 450 degrees C when depositing the dielectric film, and the second temperature can be in the range of 250 to 350 degrees C.

Furthermore, the annealing step can include providing ozone ($O_3$) and ultraviolet light in the process chamber. Alternately, the annealing step can include providing an oxygen ($O_2$) plasma in the process chamber, and this oxygen ($O_2$) plasma can be generated by RF power.

According to another aspect of the present invention, a system is provided for forming a dielectric film on a microelectronic substrate. This system includes, a process chamber which receives the substrate and isolates the substrate from an external atmosphere. This system also includes means for depositing the dielectric film on the substrate in the process chamber, and means for annealing the dielectric film in the process chamber. Accordingly, the dielectric film can be deposited and annealed while reducing exposure to air thus reducing adsorption of moisture and free carbon.

In addition, the system can include a heat source which heats the substrate to a first temperature when depositing the dielectric film and which heats the substrate to a second temperature when annealing the dielectric film. In particular, the first temperature can be in the range of 350 to 450 degrees C, and the second temperature can be in the range of 250 to 350 degrees C. The heat source can be a resistive heater or a lamp. The annealing means can include an ultraviolet lamp located in the process chamber adjacent the susceptor opposite the heat source.

The methods and systems of the present invention thus allow a dielectric film to be deposited and annealed on a substrate while reducing the exposure of the dielectric film to air. Accordingly, adsorption of moisture and free carbon by the dielectric film can be reduced. The dielectric film thus formed can have improved dielectric characteristics.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
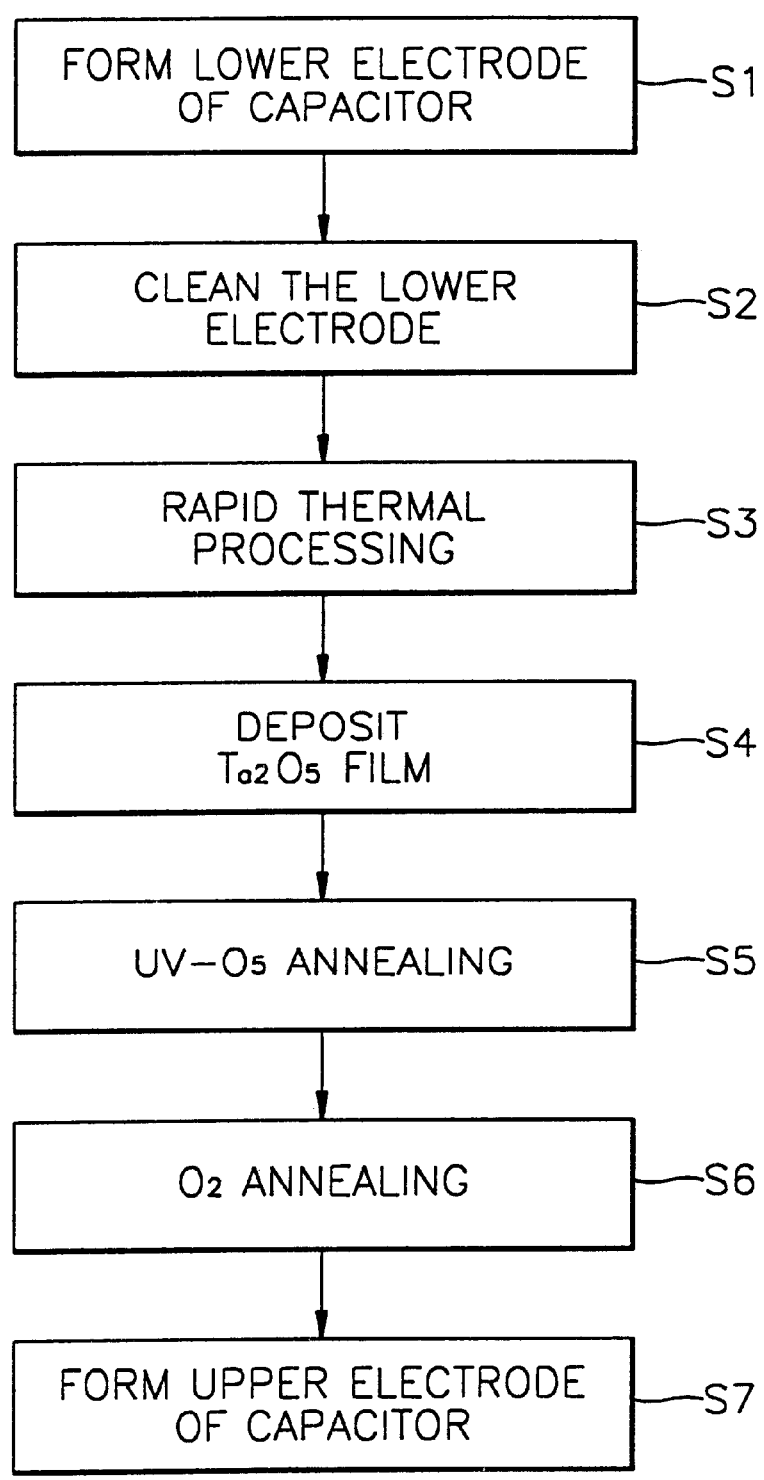
FIG. 1 is a flowchart illustrating a method for manufacturing a capacitor including a $Ta_2O_5$ dielectric film according to the prior art.
Figure 2:
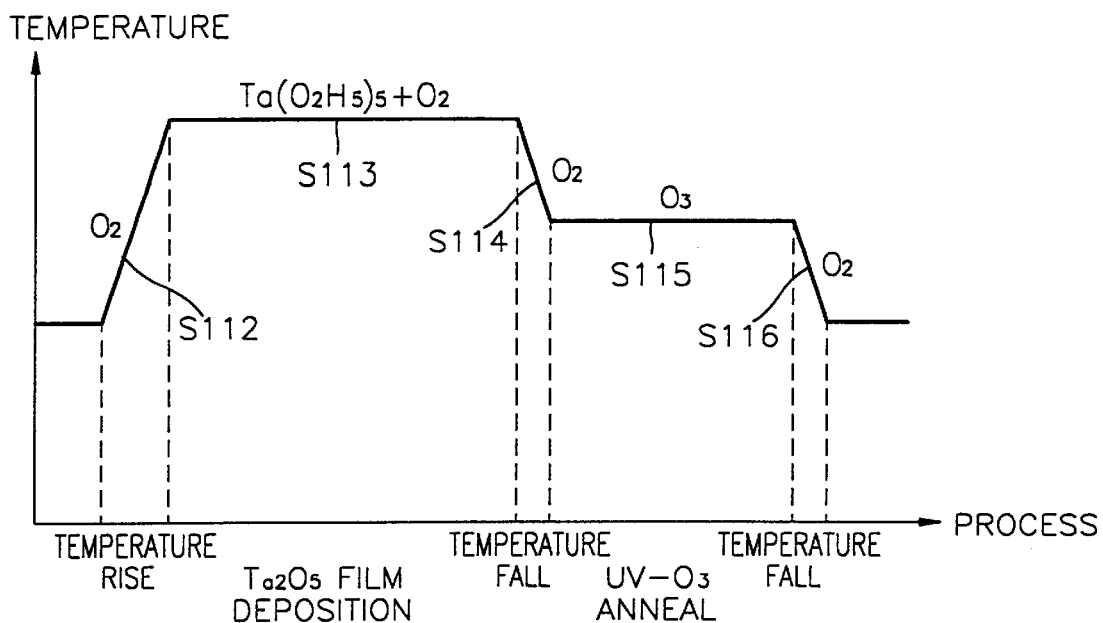
FIG. 2 is a time-temperature chart illustrating a sequence of steps in a method for forming a $Ta_2O_5$ film according to the present invention.

According to the present invention, a method for forming a $Ta_2O_5$ film includes the steps of depositing and annealing the $Ta_2O_5$ film in-situ in a single process chamber. As shown in FIG. 2, this method can include the steps of increasing the temperature inside the chamber to a first temperature on the order of 350–450° C. S12, and depositing the $Ta_2O_5$ film S13 on the substrate inside the process chamber. The temperature of the substrate inside the chamber is then lowered to a second temperature on the order of 250–350° C. S14 after depositing the $Ta_2O_5$ film. The $Ta_2O_5$ film is then annealed by providing ultraviolet light and ozone ($O_3$) S15 in the process chamber thus filling oxygen vacancies in the $Ta_2O_5$ film. The temperature is then lowered again S16 allowing the substrate with the $Ta_2O_5$ dielectric film to be removed from the process chamber. Alternately, the annealing step S15 can be accomplished by providing an oxygen ($O_2$) plasma adjacent the substrate in the process chamber. In the event that an oxygen plasma anneal is used, an RF generator can be used to produce the oxygen plasma. When using ultraviolet light and ozone, a UV lamp can be used to generate the ultraviolet light.

The process chamber of the present invention can include a single process area where the $Ta_2O_5$ film is both deposited and annealed. Alternately, the process chamber can include a first subchamber to deposit the $Ta_2O_5$ film, and a second subchamber to anneal the deposited $Ta_2O_5$ film. Accordingly, the substrate is moved from the first subchamber to the second subchamber between the steps of depositing and annealing the $Ta_2O_5$ film. Because each of the subchambers is located within the process chamber, the $Ta_2O_5$ film is not exposed to air during this transition.

In the event that two subchambers are used within a single process chamber, the method for forming the $Ta_2O_5$ film may include the steps of increasing the temperature of the substrate within the first subchamber S12 to the deposition temperature, depositing the $Ta_2O_5$ film S13, and lowering the temperature of the substrate within the first subchamber S13 to a temperature appropriate for transferring the substrate to the second subchamber. The substrate is then transferred to the second subchamber S23, and the temperature of the substrate is raised to the annealing temperature in the second subchamber S25. The $Ta_2O_5$ film is then annealed using ultraviolet light and ozone ($O_3$) S15, and the temperature of the substrate is lowered within the second subchamber S16 to a temperature suitable for removing the substrate. Alternately, the $Ta_2O_5$ film can be annealed using an oxygen plasma as discussed above.

Figure 4:
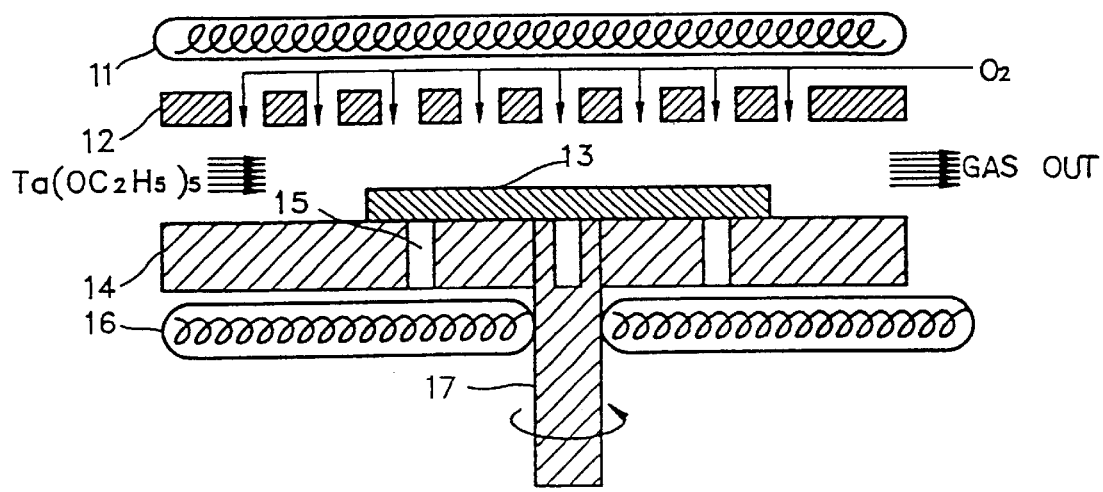
FIGS. 4 and 5 are cross-sectional views illustrating the structure of a system for forming a $Ta_2O_5$ film according to the present invention.
Figure 5:
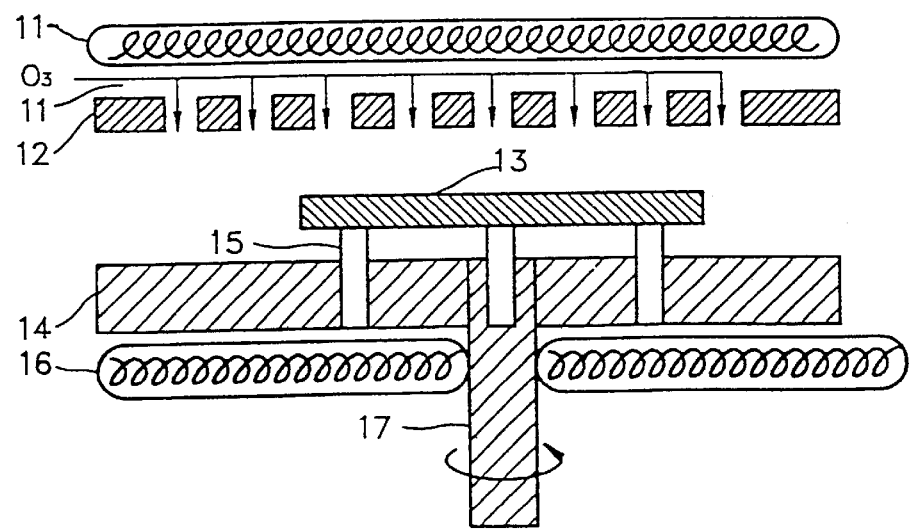

A system for forming the $Ta_2O_5$ film according to the method of the present invention is illustrated in FIGS. 4 and 5. The deposition of the $Ta_2O_5$ film and the ultraviolet ozone annealing of the $Ta_2O_5$ film (or alternately the oxygen plasma annealing of the $Ta_2O_5$ film) can be sequentially performed in a single process chamber, thus enhancing the quality of the $Ta_2O_5$ film and increasing the manufacturing throughput. The process chamber includes a light source 11 which emits ultraviolet light, a quartz window 12 which transmits the ultraviolet light and a predetermined gas such as oxygen, and a susceptor 14 on which the substrate 13 is placed. The ultraviolet light source 11 can alternately be replaced by a plasma generator when a plasma oxygen annealing step is used in place of the ultraviolet ozone annealing step. The process chamber also includes a lifter pin 15 which controls the height at which the substrate is held relative to the susceptor 14, and a heat source 16 which heats the susceptor 14 and/or the substrate 13. In addition, the substrate 13 rotates about the rotation shaft 17 thus enhancing the uniformity of the $Ta_2O_5$ film deposited thereon.

An ozone ($O_3$) injector and an RF generator can be provided in the process chamber so that the deposition of the $Ta_2O_5$ film and the annealing thereof can both be performed in situ in the process chamber. Furthermore, the heat source 16 can generate the temperatures required to perform the deposition S13 and the anneal S15, as well as the temperature ramps S12, S14, and S16 shown in FIG. 2. In particular, the lifter pins 15 can be used to vary the height of the substrate 13 relative to the susceptor 14 and the heat source 16 thus controlling the temperature of the substrate.

Figure 3:
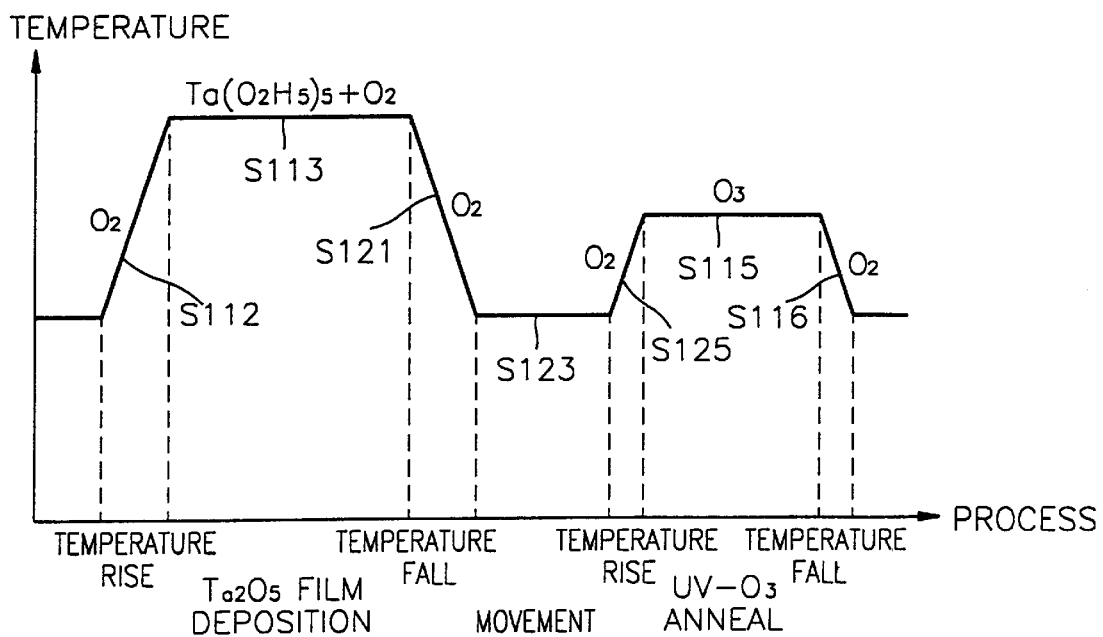
FIG. 3 is a time-temperature chart illustrating a sequence of steps in a second method for forming a $Ta_2O_5$ film according to the present invention.

When using a system having a process chamber including first and second subchambers, the step of depositing the $Ta_2O_5$ film S13 can be performed in the first subchamber, and the step of annealing the $Ta_2O_5$ film S15 can be performed in the second subchamber, as shown in FIG. 3. Accordingly, each subchamber can include a susceptor 14, a lifter pin 15, a heat source 16, and a quartz window 12. In addition, the first subchamber can include a rotation shaft 17 which enhances the deposition uniformity. The second subchamber can include a UV light source 11 and an ozone source, or an oxygen plasma generator for the annealing step. As discussed above, the first and second subchambers are provided in a single process chamber to prevent the substrate from being exposed to air during the transfer from the first subchamber to the second subchamber.

A method for forming a $Ta_2O_5$ film according to the present invention will now be discussed with reference to FIGS. 2–5. Generally, a method for forming a capacitor including a $Ta_2O_5$ dielectric film for a dynamic random access memory cell includes the steps of forming the lower electrode of the capacitor S1, cleaning the surface of a lower electrode S2, rapid thermal processing S3 resulting in nitridation, forming the $Ta_2O_5$ film S4, annealing the $Ta_2O_5$ film with ultraviolet light and ozone S5, and annealing with oxygen S6. The methods and systems of the present invention relate in particular to the steps of forming and annealing the $Ta_2O_5$ film S4–S6.

The $Ta_2O_5$ film is formed by providing a liquid source of $Ta_2O_5$ and oxygen ($O_2$) in the process chamber which is heated to a temperature in the range of 350–450° C. Accordingly, a $Ta_2O_5$ film is deposited on the substrate 13. When annealing the $Ta_2O_5$ film using ultraviolet light and ozone, ozone is generated by an ozone generator and decomposed by ultraviolet light from the UV lamp 11 wherein the ultraviolet light has a wave length on the order of 254 nm and wherein the substrate is maintained at a temperature in the range of 250–350 degrees C. Accordingly, oxygen fills oxygen vacancies in the $Ta_2O_5$ film. Alternately, the annealing step can be performed by forming an oxygen plasma.

Because the desired temperature for the deposition step (350–450 degrees C) S13 and the desired temperature for the ultraviolet ozone annealing step (250–350° C.) S15 are within the controllable temperature range of the heat source 16, the steps of depositing and annealing the $Ta_2O_5$ film can be performed in a single process chamber. Accordingly, the UV lamp 11 and ozone source are installed in the same process chamber used to deposit the $Ta_2O_5$ film.

More particularly, during the step of depositing the $Ta_2O_5$ film, the UV lamp is not turned on and ozone is not injected. After the $Ta_2O_5$ film has been deposited, however, the temperature of the susceptor 14 on which the substrate 13 is placed can be lowered by 5–10° C., and then the UV lamp can be turned on and ozone injected thus performing the annealing step S15. Accordingly, the deposition and ultraviolet ozone annealing steps can be sequentially performed in a single process chamber without moving the substrate 13 between steps. Production throughput can thus be enhanced, and the problems of moisture adsorption and free carbon adsorption can be reduced.

FIG. 3 illustrates a time-temperature chart for a method of forming a $Ta_2O_5$ film wherein the $Ta_2O_5$ film is deposited in a first subchamber, and the deposited film is annealed in a second subchamber wherein the two subchambers are contained in a single process chamber. In other words, a $Ta_2O_5$ film is deposited on the substrate in the first subchamber and then transferred to the second subchamber where the deposited film is annealed such as by ultraviolet ozone annealing. Because the substrate is not removed from the process chamber within which both of the subchambers are enclosed, the environment within the process chamber can be controlled to reduce the problems of adsorption of moisture and free carbon.

Furthermore, the temperature of each subchamber can be independently controlled. Accordingly, there is no need to change the temperature from the deposition temperature to the annealing temperature within either subchamber. Stated in other words, the temperature in the first subchamber can be set to the deposition temperature, and the temperature for the second subchamber can be set to the annealing temperature.

In FIGS. 4 and 5, the process chamber includes a ultraviolet lamp 11 or a plasma generator, and a quartz window 12. The quartz window transmits ultraviolet light to the substrate and also provides for the supply of oxygen $O_2$. The substrate 13 is placed on the susceptor 14, and the susceptor 14 heats the substrate 13 to a predetermined temperature. The temperature of the substrate 13 can thus be maintained to provide a stable reaction when a reaction gas is provided in the process chamber. The susceptor 14 can be formed from transparent quartz; an opaque metal with a high thermal conductivity and a metal compound thereof; or a material coated with a ceramic.

The lifter pin 15 can be used when transferring or positioning the substrate 13. Because the height of the lifter pin 15 is controllable, the temperature of the substrate 13 can be controlled by controlling a distance between it and the susceptor 14. In other words, the temperature of the substrate can be controlled by controlling a distance between it and the susceptor. The heat source 16 heats one or both of the susceptor and the substrate. For example, a refractory coil or a heat lamp can be used to provide the heat source 16. The rotation shaft 17 rotates the substrate 13 thus enhancing the uniformity of the $Ta_2O_5$ formed thereon.

When depositing the $Ta_2O_5$ film, the substrate 13 is placed on the susceptor 14, and the substrate 13 is heated by the heat source 16 below the susceptor 14. The temperature of the heated substrate 13 can be controlled within a range on the order of 250–55° C. When the substrate 13 reaches the desired deposition temperature (350–450 degrees C), $Ta(OC_2H_5)_5$ is injected into the process chamber from the side of the substrate 13, and oxygen ($O_2$) is provided through the quartz window 12 from an oxygen source. Accordingly, a $Ta_2O_5$ film is deposited on the substrate 13.

To reduce oxygen vacancies within the $Ta_2O_5$ film, ozone ($O_3$) is provided in the process chamber from an ozone source, as shown in FIG. 5. By providing the ozone and ultraviolet light from the UV lamp 11, while maintaining the substrate at a temperature (250–350 degrees C) lower than the deposition temperature, oxygen vacancies in the $Ta_2O_5$ film can be reduced. The lower temperature is preferred during the annealing step because when ozone is provided at the higher deposition temperature, the ozone may not be excited by the ultraviolet light, but may instead recombine to form stable oxygen ($O_2$). The oxygen vacancies may thus not be sufficiently reduced at the higher deposition temperature. The substrate temperature is thus preferably maintained below 350° C. during the annealing step.

In order to reduce the temperature of the substrate, the substrate 13 may be lifted from the susceptor 14 by a predetermined distance using lifter pins 15, as shown in FIG. 5. By increasing the distance between the substrate 13 and the susceptor 14, the heat transferred from the susceptor 14 and/or heat source 16 to the substrate 13 can be reduced thus reducing the temperature of the substrate 13. The temperature of the substrate can thus be lowered relatively quickly without transferring the substrate to a second susceptor.

Once the substrate 13 has been suitably cooled, the ozone generated by the ozone generator can be provided from outside the process chamber through the quartz window 12 to perform the ultraviolet ozone annealing step.

As described above, the steps of depositing and annealing a $Ta_2O_5$ film can be performed at different temperatures and for different times in a single process chamber thus eliminating the need to transfer the substrate. Alternately, the step of depositing the $Ta_2O_5$ film can be performed in a first subchamber and the step of annealing the film can be performed in a second subchamber wherein the first and second subchambers are enclosed within a process chamber. Accordingly, the first subchamber includes a heat source, a susceptor, a rotating shaft, a quartz window, a source of oxygen, and a source of $Ta(OC_2H_5)_5$. The second subchamber includes a heat source, a susceptor, a quartz window, a UV lamp (or a plasma generator), and an ozone source. With two subchambers, there is no need to provide both a deposition and an annealing temperature within either subchamber.

According to methods and systems of the present invention, the deposition and annealing of a dielectric film having a high dielectric constant can be performed in a process chamber. More particularly, the dielectric film can be deposited at a first temperature and annealed at a second temperature which is low relative to the first temperature without removing the substrate from the process chamber. Accordingly, unnecessary contact of the dielectric film with moisture and free carbon can be reduced thus simplifying the manufacturing process and increasing the quality of the dielectric film produced thereby.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a dielectric film on a microelectronic substrate, said method comprising the steps of:

placing said substrate on a susceptor in a process chamber wherein said substrate is isolated from an external environment;

depositing said dielectric film on said substrate in said processing chamber;

after depositing said dielectric film, annealing said dielectric film in said process chamber wherein said substrate is maintained in said process chamber during and between said depositing and annealing steps so that exposure to air is limited during and between said deposition and annealing steps; and controlling a height of the substrate relative to the susceptor to control a temperature of the substrate;

wherein said step of depositing said dielectric film includes raising the temperature of said substrate on the susceptor to a first temperature and depositing the dielectric film and wherein depositing the dielectric film includes depositing the dielectric film with oxygen vacancies therein; and wherein said step of annealing the dielectric film includes lowering the temperature of the substrate on the susceptor from said first temperature to a second temperature and annealing the dielectric film to fill at least a portion of the oxygen vacancies therein wherein the temperature of the substrate is lowered from said first temperature to said second temperature by lifting the substrate from the susceptor;

wherein said first temperature is in the range of 350 to 450 degrees C, and wherein said second temperature is in the range of 250 to 350 degrees C.

2. A method according to claim 1 wherein said dielectric film comprises $Ta_2O_5$.

3. A method according to claim 1 wherein said dielectric film comprises a material chosen from the group consisting of $BaSrTiO_3$ (BST) and $PbZrTiO_3$ (PZT).

4. A method according to claim 1 wherein the processing chamber includes a plurality of subchambers therein, and said depositing and annealing steps are performed in different subchambers.

5. A method according to claim 4, wherein a temperature within the subchamber for performing the depositing step is different from a temperature within the subchamber for performing the annealing step.

6. A method according to claim 1 wherein said annealing step includes providing ozone ($O_3$) and ultraviolet light in said process chamber while annealing said dielectric film in said process chamber.

7. A method according to claim 1 wherein said annealing step includes providing an oxygen ($O_2$) plasma in said process chamber.

8. A method according to claim 7 wherein said oxygen ($O_2$) plasma is generated by RF power.

* * * * *